(12) United States Patent
Lee

(10) Patent No.: US 7,498,632 B2
(45) Date of Patent: Mar. 3, 2009

(54) SADDLE TYPE FLASH MEMORY DEVICE AND FABRICATION METHOD THEREOF

(75) Inventor: Jong-Ho Lee, Daegu (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 42 days.

(21) Appl. No.: 11/719,934

(22) PCT Filed: Dec. 6, 2005

(86) PCT No.: PCT/KR2005/004149

§ 371 (c)(1),
(2), (4) Date: Jul. 5, 2007

(87) PCT Pub. No.: WO2006/062332

PCT Pub. Date: Jun. 15, 2006

(65) Prior Publication Data

US 2008/0157172 A1    Jul. 3, 2008

(30) Foreign Application Priority Data

Dec. 10, 2004    (KR) ...................... 10-2004-0104144

(51) Int. Cl.
*H01L 29/94*    (2006.01)
(52) U.S. Cl. ...................... 257/324; 257/288; 257/314; 257/315; 257/316; 257/321; 257/E29.309
(58) Field of Classification Search ................ 257/192, 257/288, 314, 315, 316, 321, 324, E29.309
See application file for complete search history.

(56) References Cited

U.S. PATENT DOCUMENTS 5,583,065 A    12/1996    Miwa (Continued)

FOREIGN PATENT DOCUMENTS

JP    2003-298051    10/2003

(Continued)

OTHER PUBLICATIONS

J.Y. Kim et al., "The Breakthrough ... " In Proc. Symp on VLSI Tech., P11, 2003 KR 0287068 accompanied by an English translation.

(Continued)

*Primary Examiner*—Evan Pert
*Assistant Examiner*—Tan N Tran
(74) *Attorney, Agent, or Firm*—Greenblum & Bernstein, P.L.C.

(57) ABSTRACT

The present invention relates to a nano-scale flash memory device having a saddle structure, and a fabrication method thereof. Particularly, the invention relates to a highly integrated, high-performance flash memory device having a saddle structure for improving the scaling-down characteristic and performance of the MOS-based flash memory device. According to the invention, a portion of an insulating film around a recessed channel is selectively removed to expose the surface and sides of the recessed channel. A tunneling insulating film is formed on the exposed surface and sides of the recessed channel. On the resulting structure, a floating electrode, an inter-electrode insulating film and a control electrode are formed, thus fabricating the device. Particularly when the floating electrode is made of an insulating nitride film or pluralities of nano-scale dots, an excellent memory device can be made without using an additional mask. According to the invention, the scaling-down characteristic of the device is excellent, and current drive capability can be greatly increased since a channel through which current can flow is formed on the surface and sides of the recessed channel. Also, the ability of the control electrode to control the channel can be enhanced, so that memory write/erase characteristics can be improved.

35 Claims, 14 Drawing Sheets

U.S. PATENT DOCUMENTS

| | | |
|---|---|---|
| 5,773,343 A | 6/1998 | Lee |
| 6,413,802 B1 | 7/2002 | Hu et al. |
| 6,885,055 B2 | 4/2005 | Lee |
| 7,005,700 B2 | 2/2006 | Lee |
| 2005/0145932 A1 | 7/2005 | Park et al. |

FOREIGN PATENT DOCUMENTS

| | | |
|---|---|---|
| KR | 1996-43238 | 12/1996 |
| KR | 2002-5325 | 1/2002 |
| KR | 10-20030420070 | 2/2003 |
| KR | 0287068 | 12/2003 |
| KR | 10-200474501 | 8/2004 |
| KR | 2005-64233 | 6/2005 |
| WO | 2006062331 | 6/2006 |

OTHER PUBLICATIONS

English Language Abstract of KR 2002-5325.
English Language Abstract of JP 2003-298051.

(a)

(b)

US 7,498,632 B2

SADDLE TYPE FLASH MEMORY DEVICE AND FABRICATION METHOD THEREOF

TECHNICAL FIELD

The present invention relates to a nano-scale flash memory device having a saddle structure, and a fabrication method thereof. More particularly, it relates to a highly integrated, high-performance flash memory device having a novel structure for improving the scaling-down characteristic and performance of the MOS-based flash memory device.

BACKGROUND ART

Recently, flash memory has been rapidly increasing in demand in household and portable electronic devices and is highly marketable, and thus is expected to exceed the existing DRAM market around the year 2007. Also, there is a continued need for memory devices having high integration density and fast write/erase time.

The existing flash memory devices are devices having a channel formed on a silicon surface. These devices seem to reach a limit between 45-60 nm technologies depending on memory types (NOR type or NAND type), and they require a device structure which has high performance and integration density and is compatible with the existing processes.

Problems with the existing flash memory devices include: a short channel effect resulting from a decrease in gate length; the cross-talk between cells, resulting from a reduction in the interval between the cells; an increase in threshold voltage distribution, resulting from a decrease in channel area and a decrease in the area of a floating electrode; and the maintenance of thick floating electrode to maintain a coupling ratio of 0.6-0.65 or more. One of the methods capable of solving these problems is to recess a channel region.

DISCLOSURE

[Technical Problem]

This existing recessed structure is characterized in that it can somewhat improve the short-channel effect as compared to the existing planar channel flash memory device and ensure a coupling ratio of 0.6 or more by modifying structure of floating and control electrodes under reduced thickness of a floating electrode. The existing recessed channel device that has the recess channel made through a selective silicon oxidation process, but not through dry etching, has a shallow depth, leading to the problem of a short channel effect, resulting from device scaling-down, and causes difficulty in forming shallow source/drain regions. If only the recess depth is made deep, the problems of short-channel effect and source/drain junction formation in the structure having the recessed channel region can be solved.

However, as the recess depth becomes deep and the recess width becomes narrow, the sensitivity of threshold voltage to the doping concentration or profile of corner regions formed at the bottom of the recessed channel is very high even when the corner region is made round, and the threshold voltage distribution becomes large due to structure nonuniformity of the recessed regions. Furthermore, in these recessed devices, a change in threshold voltage due to substrate bias is much greater than in the existing planar channel structure, and the effective channel length is increased due to the channel recess. Thus, the recessed structures have a shortcoming in that, the threshold voltage sensitivity will be increased with increasing bottom corner (or region) curvature of the recessed region, the current drivability will be greatly reduced with decreasing channel width and recess depth, and the threshold distribution will be increased with decreasing recess width.

The general feature of the recessed channel devices is that the control electrode is inferior in its ability to control a channel to that of the planar channel devices. This is associated with a large substrate bias effect. The present inventors have found for the first time in the world that a recessed channel device having an U-shaped channel has an advantage in that, when voltage is applied to the body (or substrate) to perform an erase operation in flash operations, the recessed channel device can perform the erase operation faster because the body surrounds the floating storage node. However, the recessed channel device has a shortcoming in that a reduction in the ability of the control electrode to control the channel makes write/erase operations by the control electrode slow.

A case where a gate electrode is excellent in its ability to control a channel is a double/triple-gate MOS structure, in which the gate surrounds the channel region. The present inventors developed, for the first time in the world, a body-tied double/triple-gate MOS structure (Korean Patent Application No. 2002-5325, Japanese Patent Application No. 2003-298051, and U.S. patent application Ser. No. 10/358, 981) and the application thereof to flash memories (Korean Patent Registration No. 0420070 and U.S. patent application Ser. No. 10/751,860, and named this structure "bulk Fin-FET".

In this structure, the channel is not recessed and is formed either on the surface and both sides of the active body or on both sides of the body, so that the structure is much superior in the ability of the gate to control the channel to the existing planar channel devices and has very small substrate bias effect. However, in order to inhibit the short-channel effect, the body width must be about ⅔ of physical gate length. This means the formation of a silicon body having a width narrower than the minimum gate length, causing a process problem.

Meanwhile, the existing flash memory devices, having a gate length of less than 60 nm, encounter a limit in scaling down. In the existing planar channel devices, to make the write/read time fast, the capacitance between the control gate and the floating storage electrode needs to be increased. The so-called coupling ratio must be increased, and for this purpose, the thickness of the floating gate must be increased. In this case, even when the device gate length is decreased, the thickness of the floating gate cannot be decreased in order to maintain a coupling ratio of more than 0.6. If the size of devices having a thick floating gate is reduced, the capacitance between the devices will be increased, which leads to increasing cross-talk between cells, thus interfering with an increase in integration density. As such, the existing devices have the scaling-down problem, the problem of improvement in write/erase speed, the cross-talk problem, and the like.

In the future, with the development of household devices and portable devices, the market of flash memories will show continued growth. Also, with improvements in the performance of these electronic devices, increasingly higher integration density and faster write/erase time will be required. If the existing device structure is used for high-density and high-performance applications, it will have the above-mentioned problems. In order to be able to solve these problems, an improvement in integration density or performance must be made based on a novel device structure.

In an attempt to improve the above problems, a self-aligned recessed channel structure as shown in FIG. 1 was proposed. The structure shown in FIG. 1 is described in Korean Patent Registration No. 0287068. In the structure shown in FIG. 1, the channel of the device is recessed so that the short-channel effect of the device can be inhibited; however, the structure has a shortcoming in that the recess depth cannot be made deep since it is limited by an oxide layer growth process for recess. If the channel length is further decreased, there will be a problem in terms of scaling down, therefore a deeper recessed channel is required. The shown channel is recessed and thus the effective channel length is somewhat increased, but there is no problem in cell area because this increase is made without increasing the area from a two-dimensional viewpoint. Also, the gate electrode is self-aligned, resulting in an improvement in integration density. Since the channel in the shown structure is simply recessed, the structure is inferior in its ability to control the channel region to the existing planar channel device structure, thus deteriorating write/erase characteristics.

A case where a device, fabricated by simply etching a channel to make a recessed channel and making a gate electrode without a floating electrode, is applied to DRAM cell technology as proposed by Samsung Electronics Co. in the year 2003 (J. Y. Kim et al., "The breakthrough in data retention time of DRAM using recess-channel-array transistor (RCAT) for 88 nm feature size and beyond," in Proc. Symp. on VLSI Tech., p. 11, 2003). In this device, the recess depth of the channel can be made deep and the effective channel length can be lengthened to greatly inhibit the short-channel effect. However, since the effective channel length is long, this device has a shortcoming in that, if the channel width of the device is decreased to increase integration density, the current drivability of the device will be significantly reduced.

Also, this device has shortcomings in that the recess width is decreased as the device size scales down, and then the bottom shape of the recessed regions becomes nonuniform, resulting in increasing threshold voltage nonuniformity.

In addition, this device has shortcomings in that two corners (or rounded bottom) clearly appear in the recessed channel region in the channel length direction, and if the channel doping concentration around these corners (or bottom) is changed even a little, threshold voltage will be greatly changed. In this device, the channel doping concentration is increased around the bottom of the recessed channel region, in which case the doping concentration can, of course, affect significantly the threshold voltage of the corner regions (or bottom). Thus the threshold voltage sensitivity with substrate (or body) bias is increased.

Also, this device has a shortcoming in that, if the recess width of the recessed channel is reduced with device scaling-down, the I-V characteristics of the device will be greatly deteriorated. Since recess-channel devices generally have a concave channel structure, they have problems in that the back-bias effect seriously occurs and, for example, the threshold voltage of NMOS devices greatly increases for a negative (−) back bias.

[Technical Solution]

Accordingly, the present invention has been made to solve the above-mentioned problems, and it is a first object of the present invention to provide a highly integrated, high-performance flash memory device in which a channel and gate structure is in the form of a saddle.

A second object of the present invention is to provide a nano-scale flash memory device structure which has a excellent scaling-down characteristic, can reduce the distribution of threshold voltage, and can improve write/erase characteristics.

A third object of the present invention is to provide a flash memory device structure in which a gate structure is of a self-alignment type so that high integration density can be realized.

A fourth object of the present invention is to provide a flash memory device structure which can improve scaling-down characteristics and write/erase speed, the advantages of the existing recess-channel devices, and can solve problems with the existing flash structure, such as a cross-talk problem, a reduction in current drive ability, a change in threshold voltage in the corner regions (or bottom) of a recessed channel, and a high sensitivity of threshold voltage to a change in impurity concentration in the corner regions of a recessed channel.

[Advantageous Effects]

As described above, the present invention can realize a flash memory device in which a channel and gate structure has a saddle structure that solves problems with the existing devices.

Because the saddle-type device structure according to the present invention has a recessed channel structure and a triple-gate structure, it has all advantages with the existing double/triple-gate and advantages with the recessed channel structure. In addition to these advantages, the present invention provides the following additional advantages.

The existing bulk FinFET requires a fin body width corresponding to about ⅔ of the gate length, whereas the inventive structure has no problem even when making the body width equal to or thicker than the gate length, and can provide the advantages intended in the present invention. Also, the inventive structure can make erase speed through the body fast, improve write/erase characteristics by increasing the ability of the control electrode to the channel, reduce a change in threshold voltage resulting from back bias, reduce a change in threshold voltage resulting from the nonuniformity of the bottom corner shape of the recessed region, and reduce a change in threshold voltage resulting from a change in impurity concentration in the corner regions of the recessed channel region.

Moreover, since the channel is formed at the surface and sides of the recessed channel region, the inventive structure can have high current drive capability and reduce the distribution of threshold voltage in a flash memory device by increasing effective channel area without increasing two-dimensional channel area. The increase in effective channel area has a characteristic in that it can greatly reduce the distribution of threshold voltage either when nitride films or high-k dielectrics are used as storage nodes or when nano-scale dots are used as floating storage nodes.

In addition, since the depth of source/drain regions can be made deep, the inventive structure can greatly improve the erase speed through both the source and drain regions as compared to the existing planar channel structure.

DESCRIPTION OF DRAWINGS

In FIG. 2, (a): a top view; (b): a three-dimensional perspective view; (c) an A-A cross-sectional view; and (d): a B-B cross-sectional view.

In FIG. 3, (a): a top view; (b): a three-dimensional perspective view; (c) an A-A cross-sectional view; and (d): a B-B cross-sectional view.

In FIG. 4, (a): a top view; (b): a three-dimensional perspective view; (c) an A-A cross-sectional view; and (d): a B-B cross-sectional view.

In FIG. 6, (a): a top view; (b): an A-A cross-sectional view; and (c) a B-B cross-sectional view.

In FIG. 7, (a): a top view of the structure shown in FIG. 2; (b) an A-A cross-sectional view; and (c) a C-C cross-sectional view.

DESCRIPTION OF REFERENCE NUMERALS USED IN THE DRAWINGS

Figure 1:
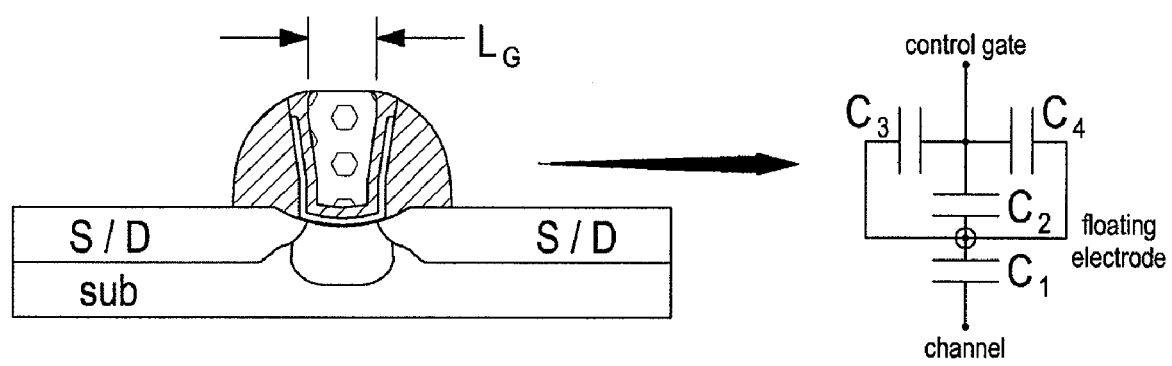
FIG. 1 shows the structure of a recess-channel, self-aligned flash memory device according to the prior art.

1: silicon substrate; 2: wall-type silicon body;
3: first insulating film; 4: first nitride film;
5: second insulating film (field insulating film or isolating insulating film); 6: second nitride film;
7: tunneling insulating film; 8: charge storage node;
9: inter-electrode (or control) insulating film;
10: control electrode;
11: source/drain regions; 12: third insulating film; and
13: insulating film spacer.

BEST MODE

In a technical concept to achieve the above objects, the present invention provides a flash memory device comprising: a silicon substrate 1 having formed thereon a wall-type silicon body 2 connected with the substrate; a first insulating film 3 formed on the surface of the silicon substrate 1 and the surface of the silicon body 2; a nitride film 4 formed on the first insulating film 3; a second insulating film 5 for element isolation formed on the nitride film 4 so as to reach the surface level of the silicon body 2; a region to be used as a channel, which is recessed from the surface of the silicon body 2 to a given depth; the second insulating film 5 being, if necessary, recessed from the surface thereof to a given depth; the first insulating film 3 and the nitride film being etched more than the recess width or depth of the silicon body 2; a tunneling insulating film 7 formed on the surface and sides of the recessed region of the silicon body 2; a charge storage node 8, an inter-electrode insulating film 9 and a control electrode 10 sequentially formed on the resulting structure; and source/drain regions 11 formed to a depth in the silicon body 2 and an insulating film spacer 13 formed on both sides of the control electrode 10.

In another aspect, the present invention provides a method for fabricating a flash memory device, comprising the steps of: forming on a silicon substrate 1 a wall-type silicon body 2 connected with the substrate; forming a first insulating film 3 on the surface of the silicon substrate 1 and the surface of the silicon body 2; forming a nitride film 4 on the first insulating film 3; forming a second insulating film 5 for element isolation on the nitride film 4 so as to reach the surface level of the silicon body 2; recessing the surface of the silicon body 2 to a given depth, to form a region to be used as a channel, and if necessary, recessing the surface of the second insulating film 5 to a given depth; etching the first insulating film 3 and the nitride film 4 more than the recess width or depth of the silicon body 2; forming a tunneling insulating film 7 formed on the surface and sides of the silicon body 2; forming on the resulting structure a charge storage node 8, an inter-electrode insulating film 9 and a control electrode 10, in order; forming source/drain regions 11 to a depth in the silicon body 2 and an insulating film spacer 13 on both sides of the control electrode 10, in order; and forming on the resulting structure a silicide film, if necessary, and then an insulating film, a contact hole and a metal layer, in order.

MODE FOR INVENTION

Hereinafter, the construction and operation of embodiments of the present invention will be described in detail with reference to the accompanying drawings.

Figure 2:
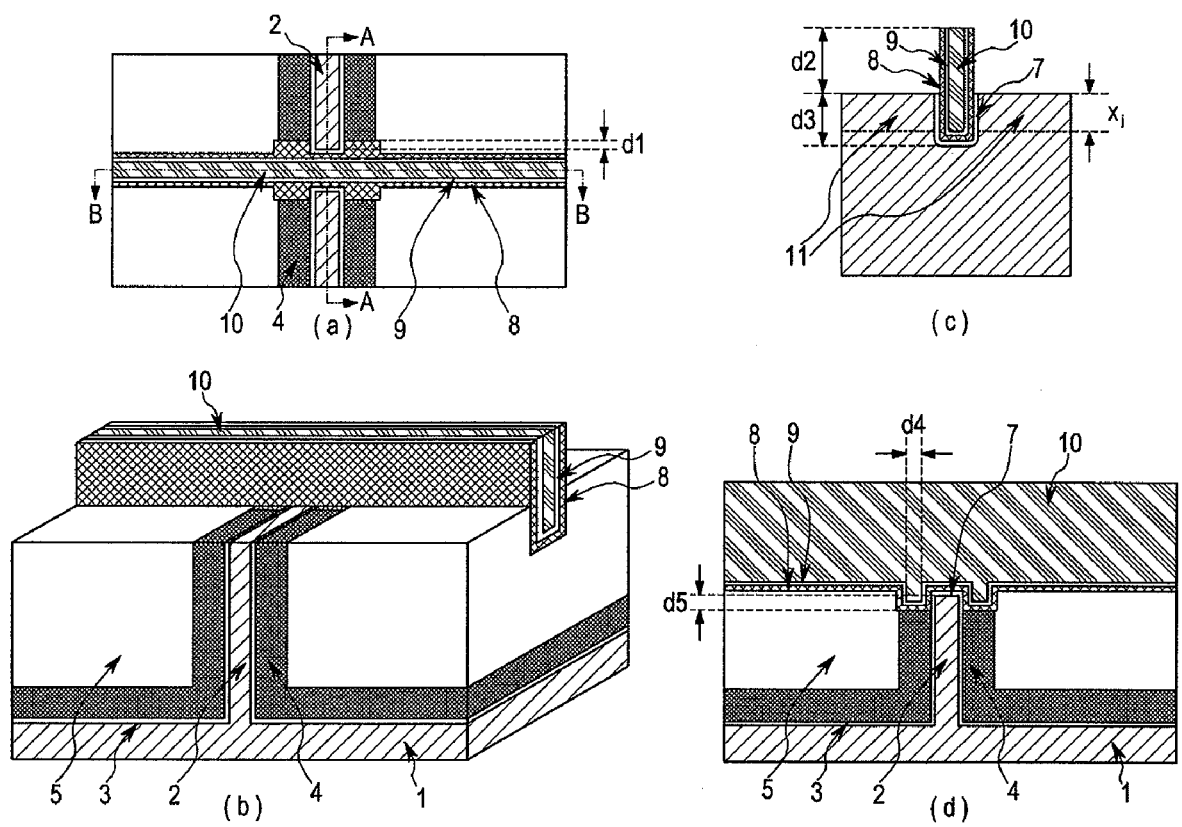
FIG. 2 shows the structure of a saddle-type flash memory device according to the present invention.

FIG. 2 shows a MOS device having a saddle structure according to the present invention. FIG. 2c is a cross-sectional view taken along an active region in line A-A of FIG. 2a, FIG. 2d is a cross-sectional view taken along a control electrode formed in the recessed channel region in line B-B of FIG. 2a. Also, the three-dimensional device structure shown in FIG. 2b shows important parts except for metal interconnections and source/drain contact regions.

FIG. 2 shows a structure just after forming a control electrode and source/drain regions, and subsequent steps are almost similar to CMOS processing technology. In FIG. 2b, region 1 is a silicon substrate, and region 2 is a wall-type silicon body in which an active channel region is formed. The thickness of the wall-type silicon body is suitably selected in a range of 3-100 nm.

Region 3 is a first oxide film (or insulating film) having a thickness of 1-20 nm. Region 4 is a nitride film, the thickness of which can be adjusted depending on a given technology level and may vary in a range of 1-200 nm. Region 5 corresponds to a field insulating film or isolating insulating film for isolation between elements, and the thickness thereof is suitably selected in a range of 50-1000 nm.

Region 7 is a tunneling insulating film formed between the exposed surface and sides of a recessed channel, and has a thickness of 1-15 nm. Region 8 represents a floating storage electrode (or charge storage node). The charge storage node may be made of a conductive material, such as amorphous silicon, polysilicon, or amorphous SiGe, or poly-SiGe, and preferably has a thickness of 1-100 nm. If the region 8 is made of a conductive material, a process of isolating a conductive floating electrode between cells using an additional mask will be required for isolation between cells, and the floating storage electrode of region 8 may be limited to a region where a channel and a control electrode meet each other.

The floating storage electrode may be made of dots in the form of nano-particles ensuring automatic isolation, or insulating materials having many traps, such as nitrides and high-k dielectrics. The nano-particles may be made of, e.g., silicon, SiGe, metal, metal oxide, metal alloy, or an insulating material having a band gap smaller than a silicon oxide film. If the floating storage electrode is made of nano-scale dots, the size of each of the dots will preferably be 1-50 nm, and if it is made of a material containing traps, such as a nitride film, the thickness thereof will be 1-50 nm.

In the structure according to the present invention, since a channel is formed at not only the surface of the recessed silicon region but also the sides thereof, nano-scale dots or an insulating material having traps can be formed on a wider channel surface and so the distribution of threshold voltage can be reduced. Region 9 represents an inter-electrode insulating film, which preferably has a thickness of 2-30 nm and can be made of high-k dielectrics, including oxides. Moreover, it may also be made of a stack of various oxides or dielectrics.

Region 10 represents a control electrode, which has a thickness of 2-500 nm and may be made of amorphous silicon, polysilicon, amorphous SiGe, poly-SiGe, metals having various work functions, silicides, or a stack of said materials. In the structure shown in FIG. 2, the width of the recessed region may be the same or somewhat different from the width of the control electrode formed thereon.

Part (a) of FIG. 2 shows the top side (top view) of part (b) which is a three-dimensional view. In part (a) of FIG. 2, distance d1 is a distance obtained by etching the nitride film of region 4 with respect to the edge of the recessed active region so as to make the etched away portion larger than the width of the recessed region of the active silicon body, thus causing an insulating film and gate stack to surround the sides of the recessed channel. Distance d1 is in a range in 0-200 nm.

In part (c) of FIG. 2, d2 represents the height of the gate stack, protruded upward from the surface of the active silicon. Moreover, the gate except for the floating electrode 8 may also be protruded upward. The protruded height is in a range of 0-500 nm. In part (c) of FIG. 2, d3 represents the depth recessed from the surface of the active region and is in a range of 10-300 nm.

In part (d) of FIG. 2, the corners of the recessed region can be made angular or round, according to applications. In part (d) of FIG. 2, d4 is associated with the thickness of the nitride film 4 and represents the width of the control electrode surrounding the sides of the channel. d4 is in a range of 3-200 nm. In (d) of FIG. 2, d5 has essentially the same size as d1 shown in FIG. 2a, and represents the distance by which the sides of the recessed channel are exposed. In some cases, the exposed distance of the side channel in the depth direction in the recessed channel may be made larger than the distance d1 on the surface. After forming the structure as shown in part (b) of FIG. 2, a spacer may be formed around the gate stack. The width of the spacer can be made larger than the width of the floating storage node shown in part (a) of FIG. 2. By doing so, in a subsequent process of carrying out contact etching after forming an insulating film, the storage electrode can be prevented from forming short circuits with a metal layer filled in the contact hole. Thus, this can effectively increase integration density.

Figure 3:
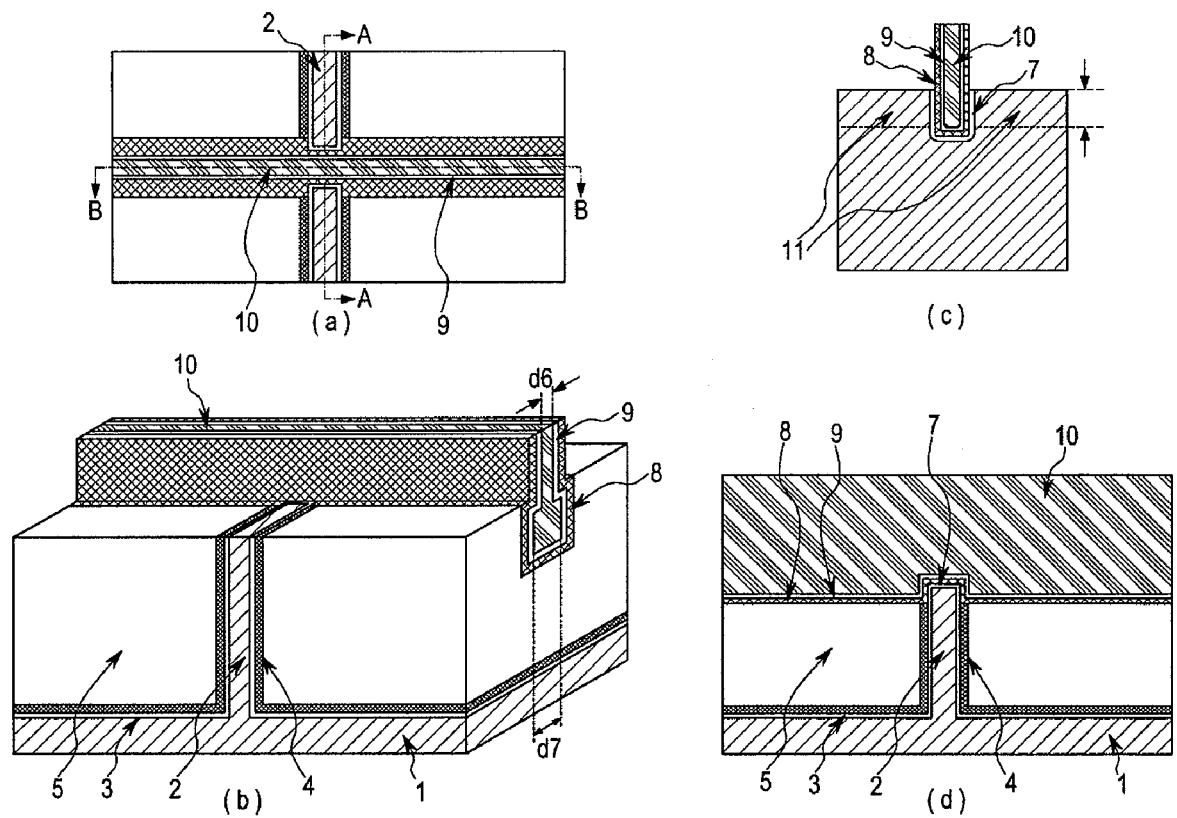
FIG. 3 shows the structure of a flash memory device according to a modified embodiment of the present invention.

FIG. 3 shows a slight modification of the structure shown in FIG. 2. The difference from FIG. 2 is the cross-sectional shape of region 10 shown in the right side of part (b) of FIG. 3. In forming the self-aligned gate structure shown in FIG. 2, only the insulating film of region 3 and the nitride film of region 4 are etched to a width larger than the width of the surface of the recessed silicon body region shown in FIG. 2 (a), an insulating film and gate stack is then formed. Thus, the width of the recessed region in the field insulating film for isolation is not greatly changed compared to the originally defined size.

However, in the structure shown in FIG. 3, a process of etching the insulating film of region 3, the isolating insulating film of region 5 and the nitride film of region 4 more wide than the recess width is required to form side channels in the recessed silicon region. In this case, the width of the recessed region (the sum of the thicknesses or widths of d7 in FIG. 3 and regions 8 and 9 located on both sides thereof) may be larger than the above defined gate open width (the sum of the thicknesses or widths of d6 in FIG. 3 and regions 8 and 9 located on both sides thereof), and a cross-sectional structure as shown in the right side of FIG. 3 (b) is formed. In some cases, the gate stack width including d6 may also be larger than the gate stack width including d7.

The width of a control electrode formed above the surface of non-recessed regions 2, 3, 4 and 5 may also be made similar to that in the recessed region, according to process conditions. Regarding the insulating film, the storage electrode and the application field, those mentioned in the description of FIG. 2 are applied to FIG. 3 as they are. In FIGS. 2 and 3, the nitride film of region 4 between the insulating film 3 adjacent to the wall-type silicon body of region 2 and the insulating film of region 5 is selectively etched compared to other regions when clearly forming the side channels on the recessed region and thus is of help to form the structure.

Figure 4:
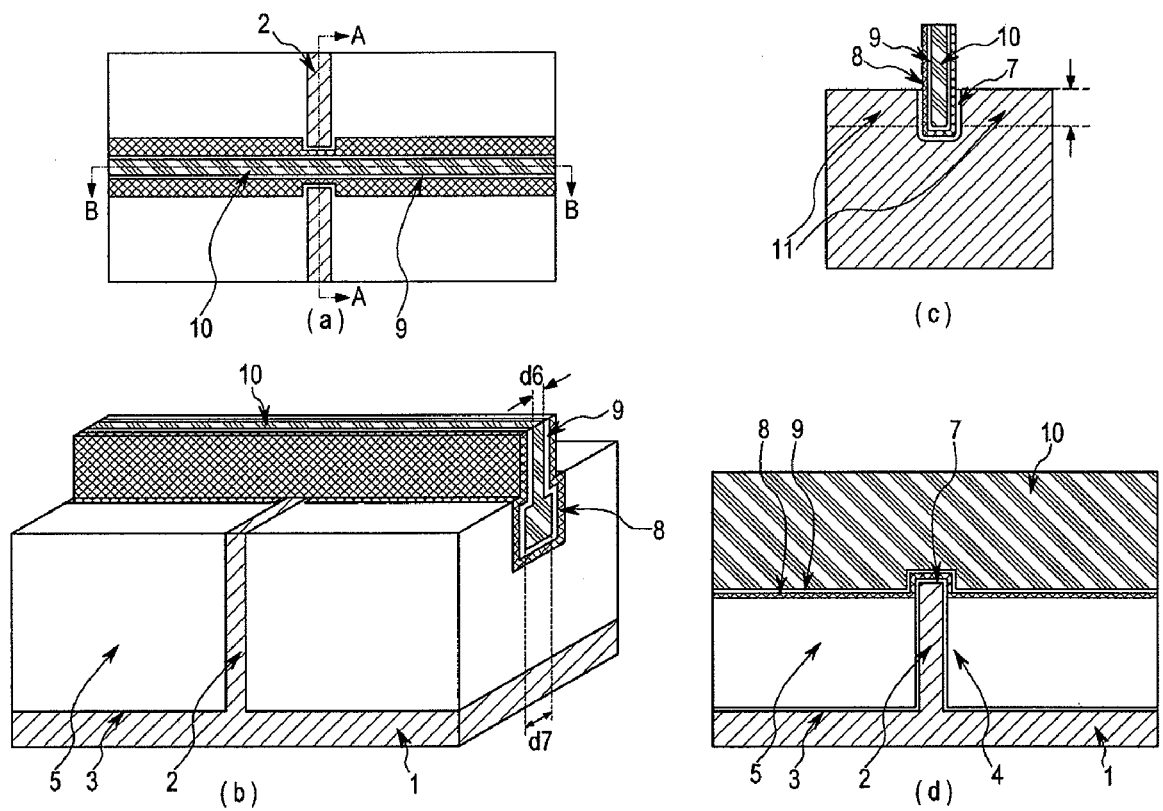
FIG. 4 shows the structure of a flash memory device according to another modified embodiment of the present invention.

FIG. 4 shows a structure similar to the structures shown in FIGS. 2 and 3. In the structure shown in FIG. 4, the nitride film of region 4 is omitted. The structure in FIG. 4 provides the same effects as mentioned for FIG. 3 without using the nitride film of region 4. In the control electrode of region 10 shown in FIG. 4, the width of the recessed region indicated by d7 is formed larger than the width of the non-recessed region indicated by d6. By modifying process conditions, d6 may also be larger than d7. The recessed wall-type silicon body region 2 and the recessed isolating oxide film region 5 are first formed, and the isolating insulating film 5 is additionally etched to form channels on the sides of the recessed channel, the essential element of the present invention, thus making the structure as shown in part (b) of FIG. 3. All other technical features are the same as mentioned for the structure shown in FIG. 2.

Figure 5:
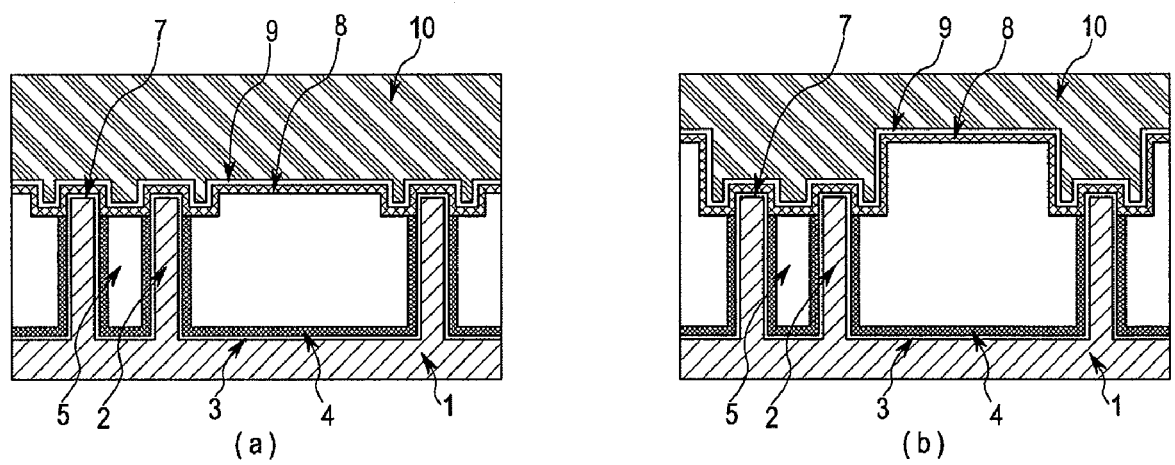
FIG. 5 is a cross-sectional view taken in the direction of the control electrode in FIG. 2.

Part (a) of FIG. 5 illustrates that pluralities of wall-type bodies 2 are formed in the structures of FIGS. 2 and 3, and shows cross-sectional structures between wall-type bodies close to each other and between bodies distant from each other, taken along the control electrode. Part (b) of FIG. 5 shows that, in the structures of FIGS. 2 and 3, alignment to the silicon body and etching have been performed such that only the silicon body of region 2 and the insulating film 3 and nitride film 4 around thereof are etched. Namely, it is the case where the isolating insulating film 5 is intentionally not recessed. If the interval between the silicon bodies 2 is close, a portion of the isolating oxide film of region 5 is etched laterally on both sides in a process of recessing regions 3 and 4 and a subsequent cleaning process, and thus shown as if it is recessed.

In part (b) of FIG. 5, if the interval between the silicon bodies is long, the thickness of the initially formed isolating oxide film 5 is maintained almost intact. The interval between the wall-type bodies can be small or even equal to the minimum body width (3 nm), and can be changed by trimming a process for body formation or changing the distance in physical layout. Referring to the left side of parts (a) and (b) of FIG.

5, the interval between the silicon bodies can be seen to be close, in which case the thickness of the isolating insulating film present between the silicon bodies is thinner than the thickness of the insulating film present between the silicon bodies having a long interval therebetween on the right side. This occurs in processes of recessing the bodies of region 2 to a suitable depth and then etching the insulating film between the bodies to form channels on the sides of the recessed channel.

Figure 6:
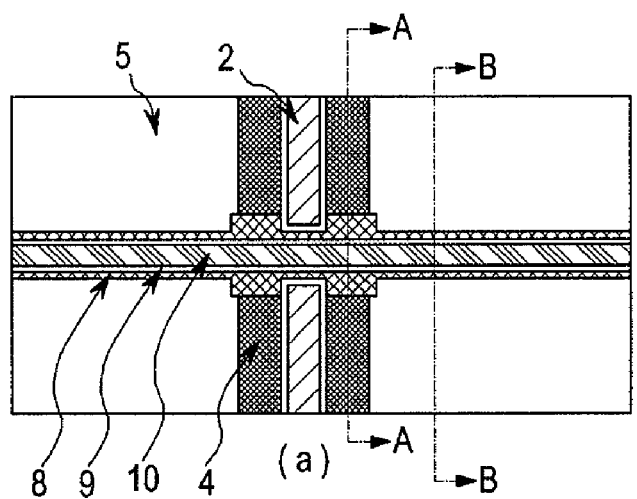
FIG. 6 shows cross-sectional views taken across the control electrode in FIG. 2.
Figure 6:
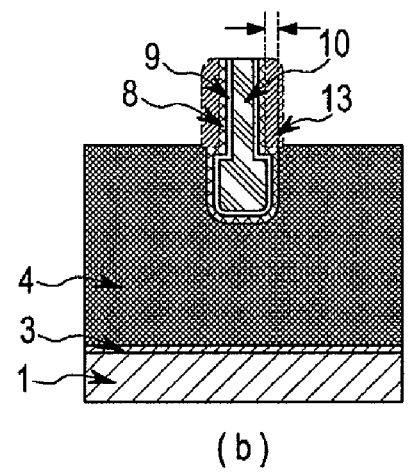
Figure 6:
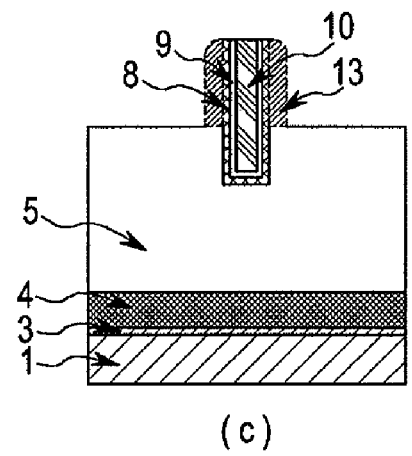

Part (a) of FIG. 6 is a cross-sectional view taken along the center of the nitride film of region 4 formed on the side of the wall-type silicon body 2 in part (a) of FIG. 2, and part (b) of FIG. 6 is a cross-sectional view taken across the control electrode on the isolating insulating film. In part (b) of FIG. 6, since the recess width of the nitride film of region 4 is made larger than the recess width of the silicon body or the isolating oxide film by selective etching, the width of the control electrode in the recessed nitride film region is made wider. If the width of the nitride film of region 4 is suitably adjusted, the control electrode in the recessed region can be made without the formation of voids.

In the case of part (c) of FIG. 6, since there is no nitride film to be etched in the isolating insulating film of region 5, the width of a gate stack (including a floating storage node, an inter-electrode insulating film and a control electrode) in the recessed isolating insulating film is almost similar to the width of a control electrode formed on the surface of the silicon body. According to process conditions, the width of the gate stack formed on the surface of the silicon body may be made wider or narrower. In parts (b) and (c) of FIG. 6, a spacer of region 13 is shown in the form of a dashed-line, and is formed after forming the control gate electrode. The suitable width of the spacer is such that it can sufficiently cover the storage node of region 8 shown in part (a) of FIG. 6.

Figure 7:
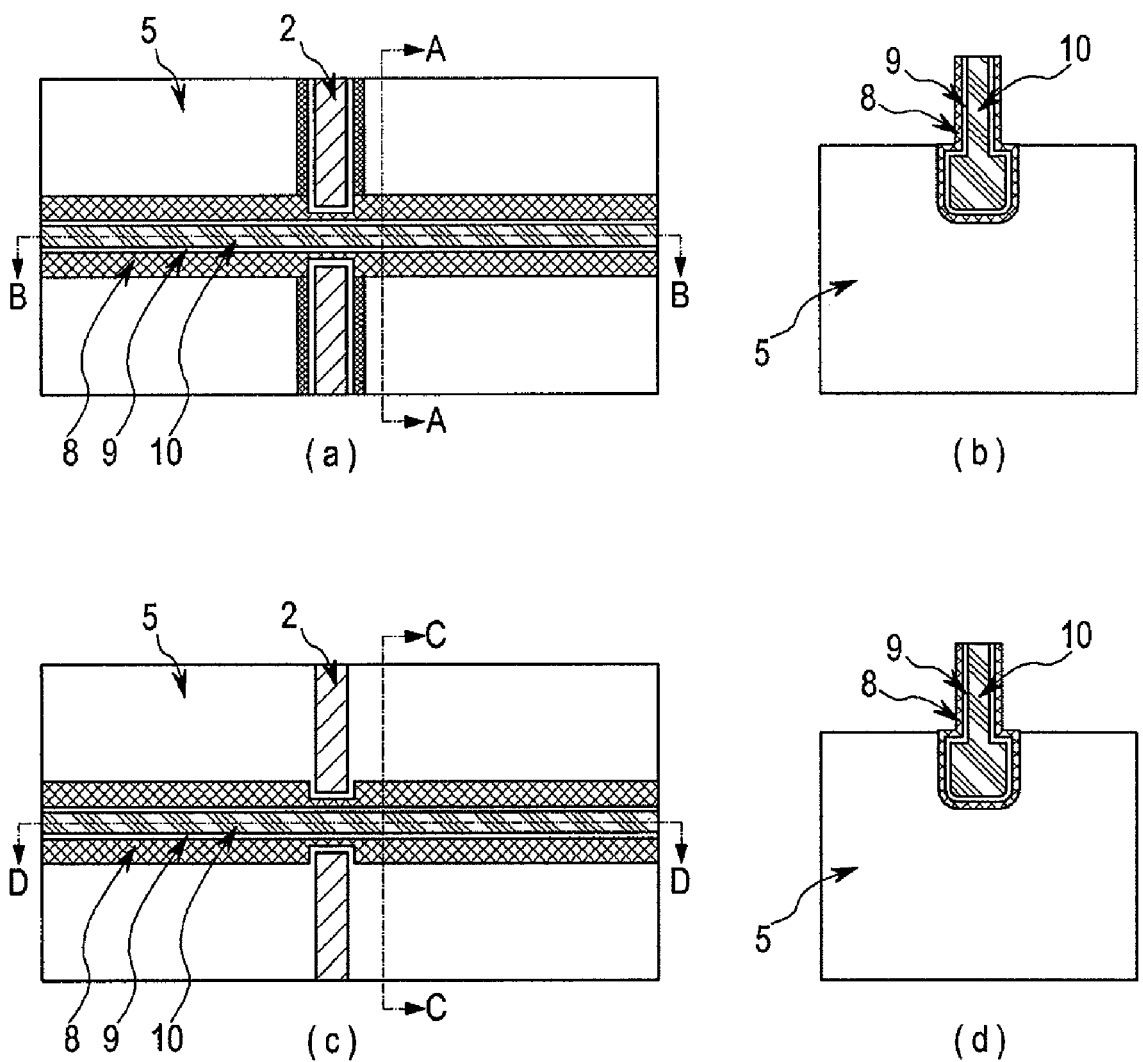
FIG. 7 shows cross-sectional views taken across the control electrode in the isolating insulation film shown in FIGS. 3 and 4.

Parts (b) and (d) of FIG. 7 are cross-sectional views taken across the control electrode in the isolating insulating region shown in FIGS. 3 and 4. Parts (a) and (b) of FIG. 7 correspond to FIG. 3, and parts (c) and (d) of FIG. 7 correspond to FIG. 4. As mentioned above in the description of FIGS. 3 and 4, a channel is formed at the surface and sides of the recessed silicon body. The side channel is formed along the surface of the recessed silicon body and the width of the side channel is determined by partially etching the insulating film 3, the nitride film 4 and the isolating insulating film 5. Thus, the element isolating region below the surface of the silicon body region becomes larger than the above-defined recess width. For this reason, the structures as shown in parts (b) and (d) of FIG. 7 are formed. It will be understood that the width of the gate stack above or below the surface of the silicon body can be adjusted through changes in process conditions.

Figure 8:
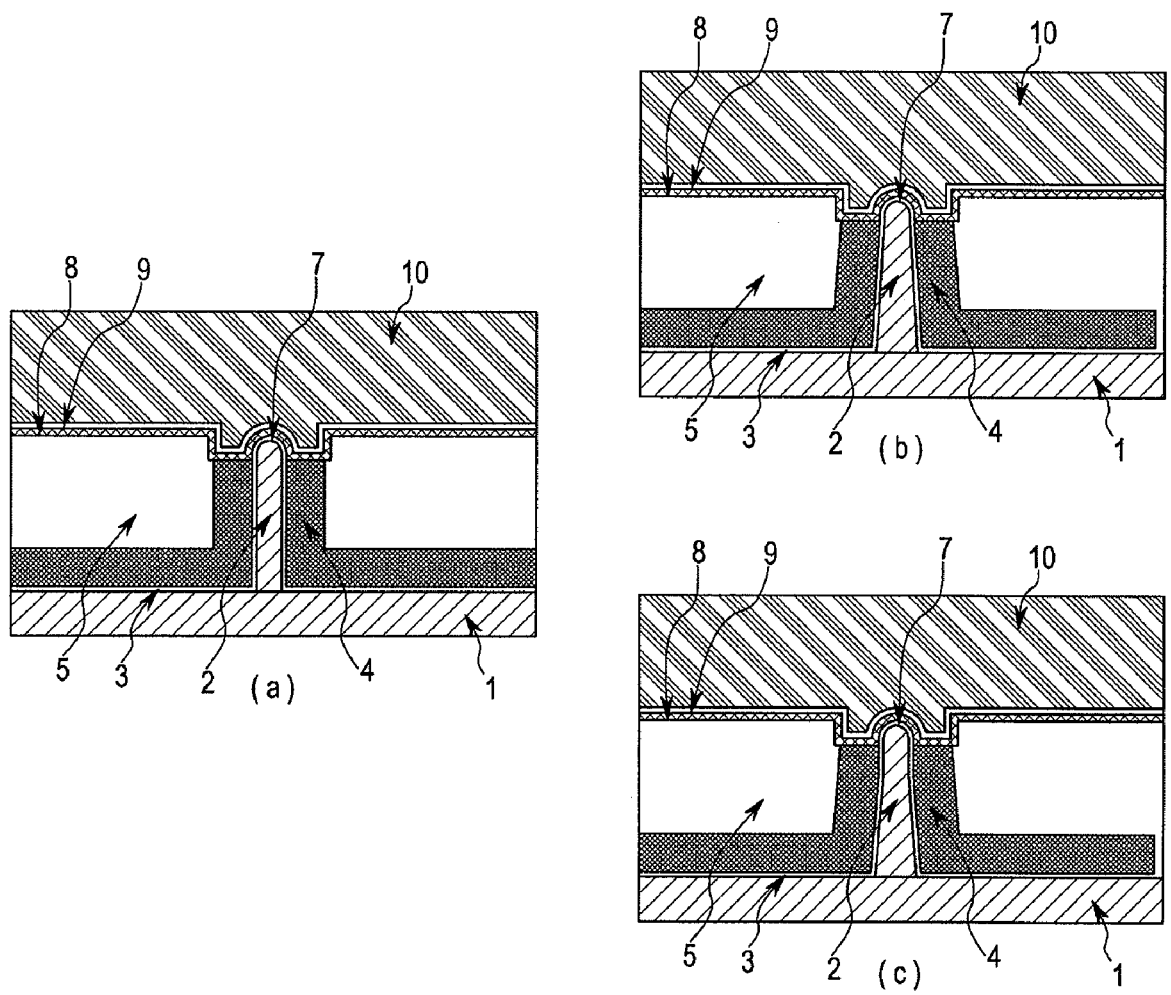
FIGS. 8a to 8c are cross-sectional views showing that the corner between the surface and sides of a recessed channel region in the structure shown in FIG. 2 is made round.

FIG. 8 shows the cross-sectional structures of a wall-type silicon body, taken along a control electrode at a point where the control electrode and the silicon body in the structure of FIG. 2 meet each other. The corners formed along the surface of the recessed silicon body of region 2 are made round. This can improve the reliability of the device by preventing the concentration of electric field from the control electrode and reduce leakage current by removing parasitic channels which can be formed along the corners.

In part (b) of FIG. 8, the corners of the recessed silicon channel region are made round, and the body becomes gradually larger toward the substrate of region 1 so as to be able to reduce the resistance of the body. In part (c) of FIG. 8, the corners of the recessed silicon body are made round, the silicon body of region 2 is maintained almost vertical around channels including side channels and is gradually larger below thereof.

Figure 9:
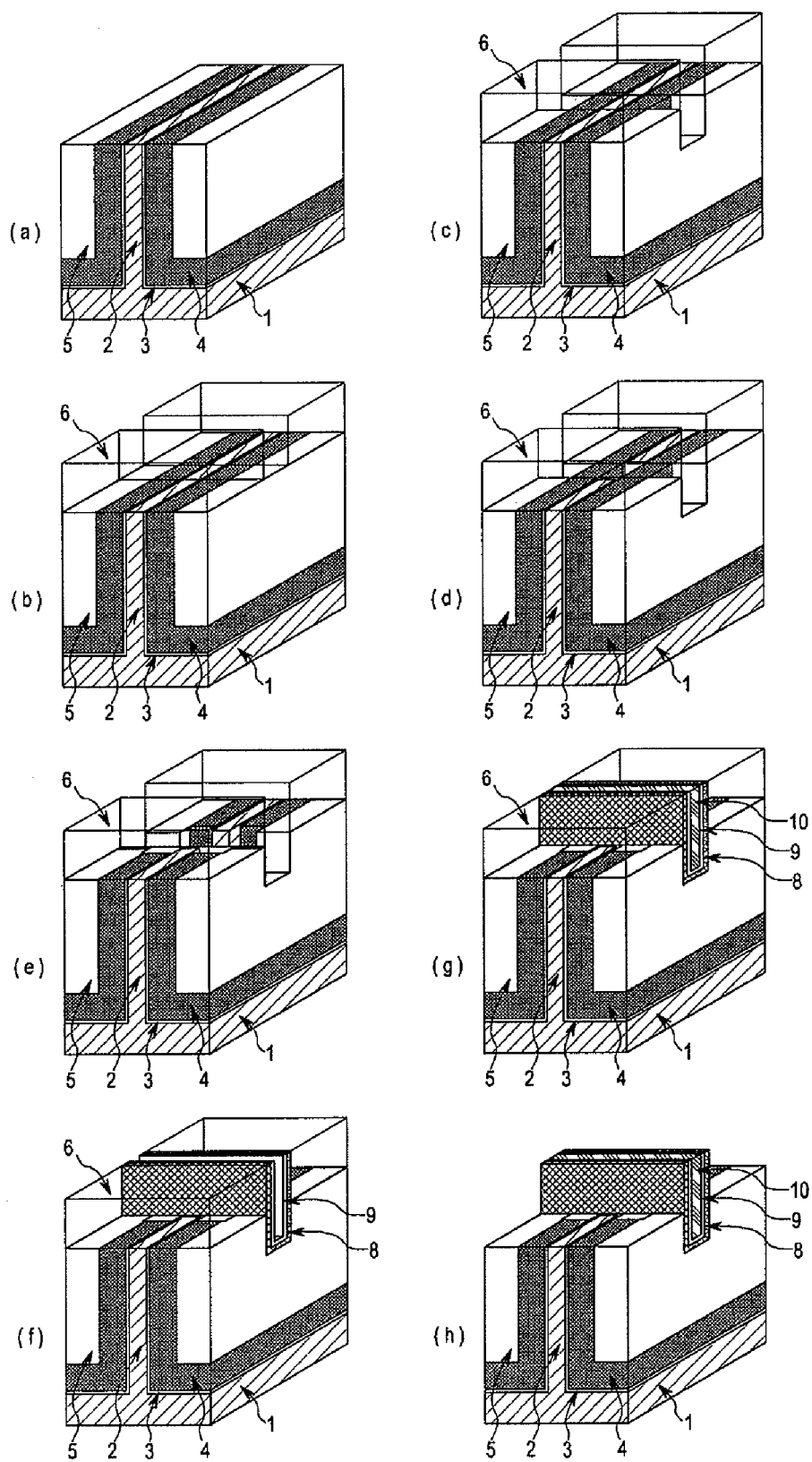
FIGS. 9a to 9h show a first embodiment of a process for making the structure of FIG. 2.

FIG. 9 shows one embodiment of a method for making the device structure according to the present invention and is presented for a better understanding of device realization. FIG. 9 shows key process steps to be processed after a silicon body in which a channel is formed and device isolation in the form of STI (Shallow Trench Isolation) are made, and the surface is planarized. In this case, the method can be carried out in a state where some oxides have been formed on the surface of the silicon body.

Part (a) of FIG. 9 shows a planarized state after an isolation step. Part (b) of FIG. 9 shows a structure obtained after forming a nitride film of region 6 for gate opening, and removing the nitride film 6 using a gate open mask. If necessary, the process may be carried out with patterned photoresist that remains on the nitride film of region 6. Part (c) of FIG. 9 shows that the insulating film of region 5 for element isolation has been partially etched using a defined gate open mask.

Then, as shown in part (d) of FIG. 9, the silicon body of region 2 is etched to a suitable depth using the same mask. Following steps can be performed after forming a sacrificial oxide film for protecting the recessed silicon surface. As shown in part (e) of FIG. 9, the nitride film is then suitably etched with the adjustment of time, by which the recessed nitride film is formed wider and deeper than the recess width or depth of the silicon body region. In this step, the nitride film of region 6, together with the nitride film of region 4, can be etched according to a given process condition. Since the nitride film region 4 remaining between the silicon body region etched and the isolating insulating film etched as shown in FIG. 9d can be etched on both sides, it can be completely removed when about ½ of the thickness of the nitride film of region 4 is etched away. In order to adjust the width of channels exposed on the sides of the recessed silicon body region, the etching of the nitride film 4 can be adjusted.

In this step, since the nitride film of region 6 is partially removed at the same time, the width of the gate stack formed above the surface of the silicon body can be made larger than that formed in the recessed silicon region. In order to maintain the width of the gate stack above the recessed region almost equal to the width of the gate stack in the recessed region, region 6 may be made of a material with an etch selectively to other materials or easy-to-remove material or a stack of materials (i.e., a two or more layer structure).

For example, polysilicon or amorphous silicon in place of the nitride film of region 6 having the problem of selectivity is formed and its surface is oxidized, and in this state, the processes shown in FIGS. 9b to 9e can be carried out using a gate open mask in a range ensuring a suitable etch selectivity. Furthermore, it will be understood that, in the processes shown in FIGS. 9b to 9e, the insulating film of region 5, the nitride film of region 4 and the silicon body of region 2 may be etched in various orders. In part (e) of FIG. 9, when region 4 is etched to a suitable thickness and the insulating film of region 3 underlying region 4 is then etched, the surface and sides of the recessed silicon body region will be exposed.

Then, a suitable cleaning process or a hydrogen annealing process is selectively carried out, and the tunneling insulating film of region 7 is formed. Then, the floating storage node of region 8 is formed and the inter-electrode insulating film of region 9 is formed, thus obtaining a structure as shown in part (f) of FIG. 7. The floating storage node may be made of polysilicon or amorphous silicon, poly SiGe or amorphous SiGe, various high-k dielectrics capable of trapping electric charges, nitrides, or conductive or non-conductive nano-scale (less than 50 nm) dots. The inter-electrode insulating film of region 9 may be made of various insulating films or a combination of insulating films (e.g., oxide-nitride-oxide).

Part (g) of FIG. 9 shows that a control electrode material has been deposited and planarized. Part (h) of FIG. 9 shows that the nitride film of region 6 has been selectively removed. Subsequent processes includes spacer formation, silicide formation (if necessary), insulating film formation, contact formation, metal interconnection, and the like, and are performed in a manner similar to the existing processes. In the embodiment shown in FIG. 9, channel doping can be performed following the process shown in part (a) or (d) of FIG. 9. If the channel doping is performed following the process shown in part (d) of FIG. 9, it can be selectively performed only in the recessed region. Source/drain doping is preferably carried out following the process shown in part (h) of FIG. 9. In some cases, ion implantation for source/drain doping is carried out throughout the silicon body of region 2 as shown in part (a) of FIG. 9, and a region, which will serve as a channel, is selectively etched, whereby source/drain regions isolated from each other can be formed.

Following the process shown in part (h) of FIG. 9, an insulating film spacer may be formed to a thickness of 5-200 nm. Preferably, the spacer material completely covers region 8 around the control electrode shown in part (a) of FIG. 2, such that region 8 and metal are not short-circuited with each other when forming contact holes and metal interconnections. The spacer may be made of an insulating film stack of two layers or more having different properties (e.g., a spacer formed by stacking a nitride film on an oxide film). In the structure shown in FIG. 9, the nitride film of region 6 is used to make a self-aligned gate stack, and other materials having etch selectivity may also be used.

Figure 10:
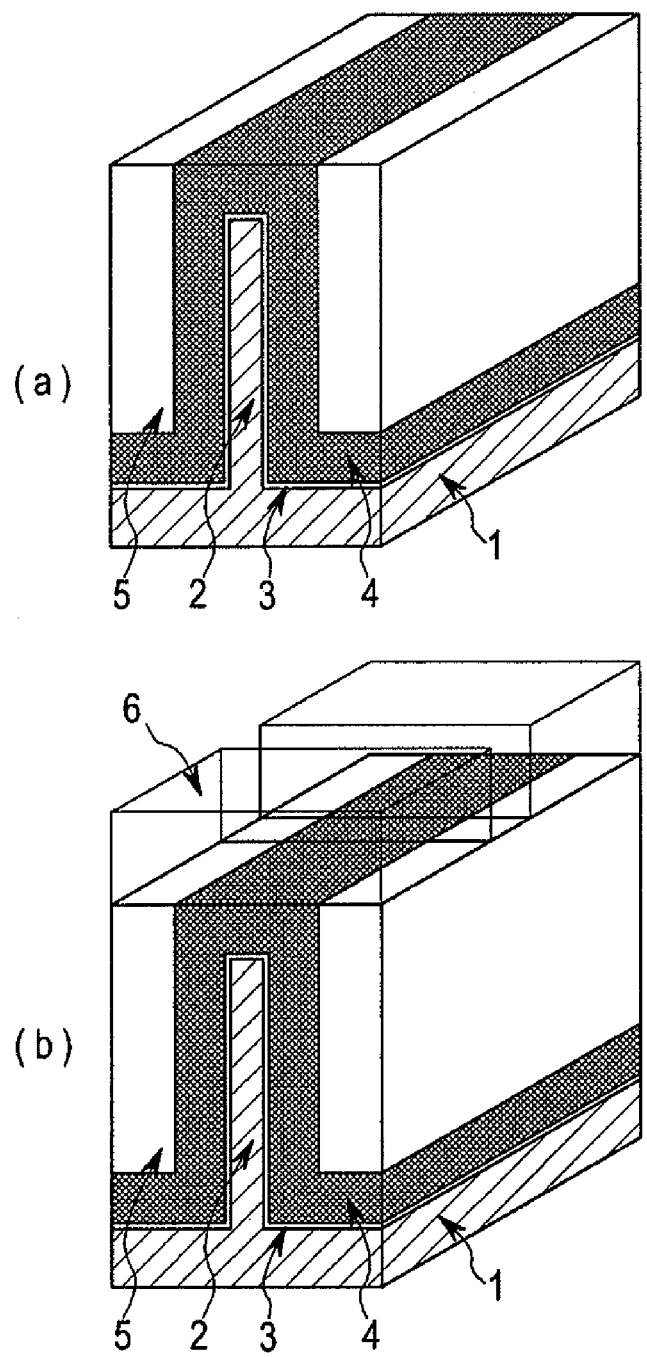
FIG. 10 shows a second embodiment of a process for making the structure of FIG. 2, in which the steps (a) and (b) in the process shown in FIG. 9 are modified.

FIG. 10 shows a structure capable of substituting for the structure shown in part (a) of FIG. 9. An STI element isolation region is formed using the nitride film of region 4, and then fabrication processes similar to FIG. 9 are performed.

Figure 11:
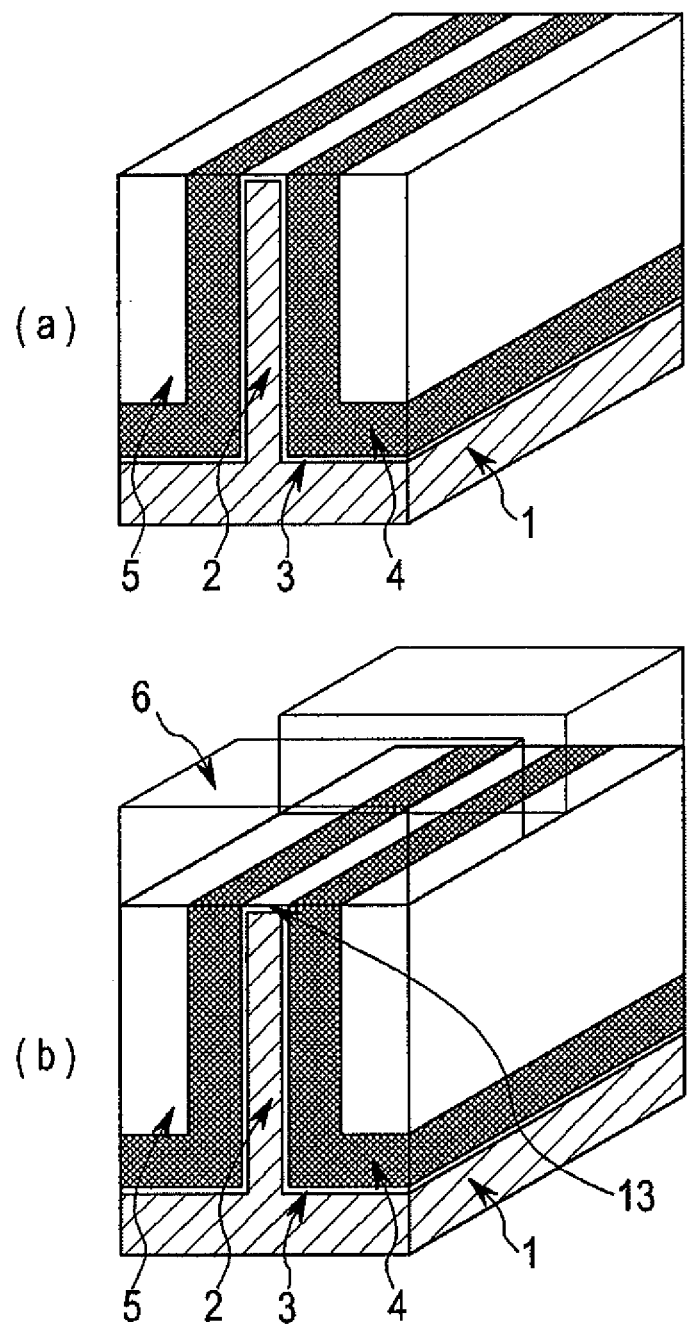
FIG. 11 shows a third embodiment of a process for making the structure of FIG. 2, in which the steps (a) and (b) in the process shown in FIG. 9 are modified.

FIG. 11 shows a structure obtained by forming a thin oxide film on the surface of the silicon body in the structure shown in part (a) of FIG. 9 and then carrying out processes similar to FIG. 9. For example, the structure shown in part (a) of FIG. 11 is obtained by selectively etching the insulating film of region 5 shown in part (a) of FIG. 10 up to the vicinity of the silicon surface and selectively removing the nitride film of region 4 up to the vicinity of the surface of the silicon body.

Figure 12:
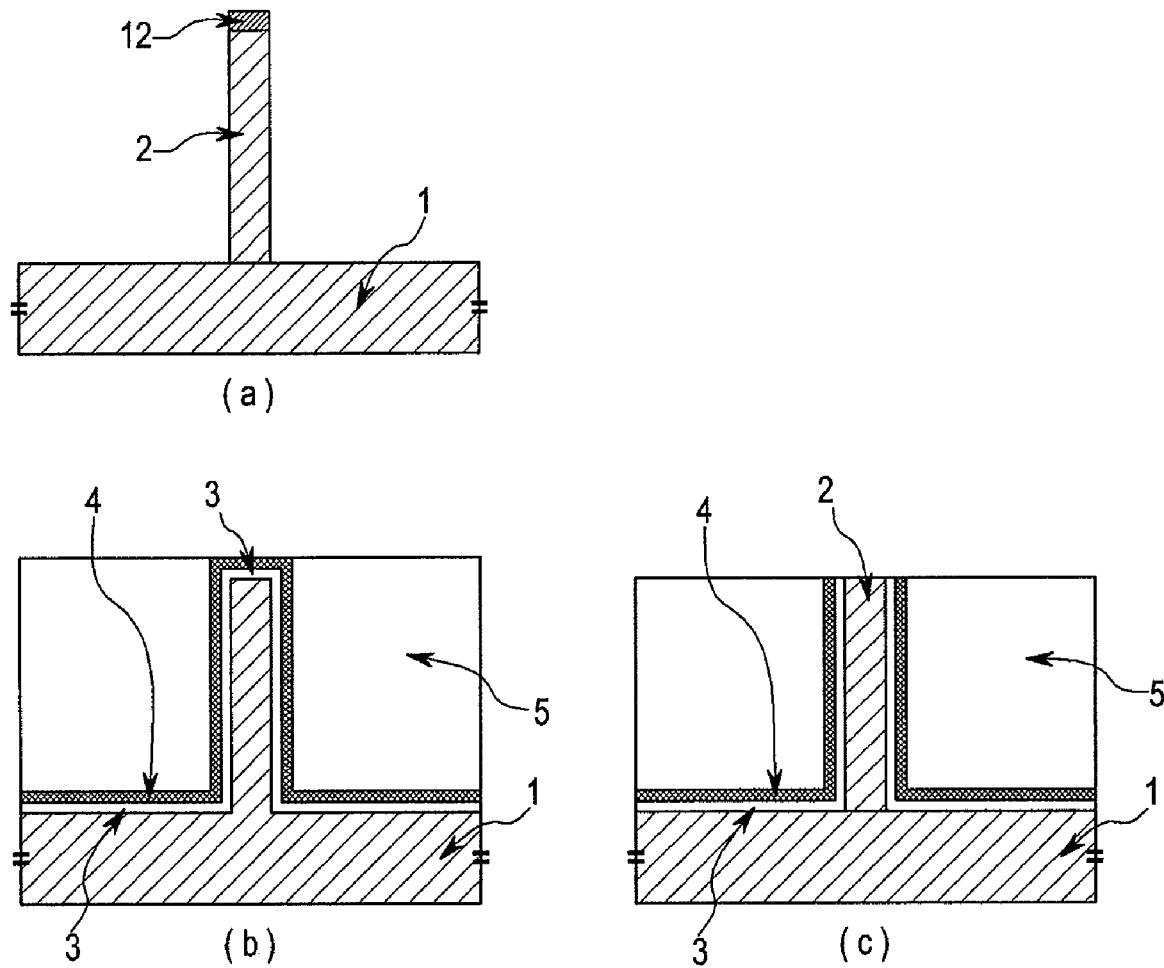
FIGS. 12a to 12c show a first embodiment of a process for making regions 1, 2 and 5 for making the inventive body structure.

FIG. 12 shows one method for forming the structure shown in part (a) of FIG. 9. On the silicon substrate of region 1, the insulating film of region 12 is formed, after which the insulating film is removed using a mask for defining the active body, and the silicon substrate is etched to a suitable depth of less than 500 nm as shown in part (a) of FIG. 12, thus making the wall-type silicon body of region 2. Also, a process for reducing the width of the silicon body may be additionally performed, and an annealing process for improving the sides of the silicon body may also be carried out.

Thereafter, the insulating film is completely removed, and then the insulating film of region 3 is formed to a thickness of more than 1 nm, on which the nitride film of region 4 is formed. Then, a thick insulating film is formed and planarized, thereby forming the isolating oxide film of region 5 as shown in part (b) of FIG. 12. By a suitable planarization process, including that mentioned in the description of FIG. 12, a structure shown in part (c) of FIG. 12 can be obtained.

Figure 13:
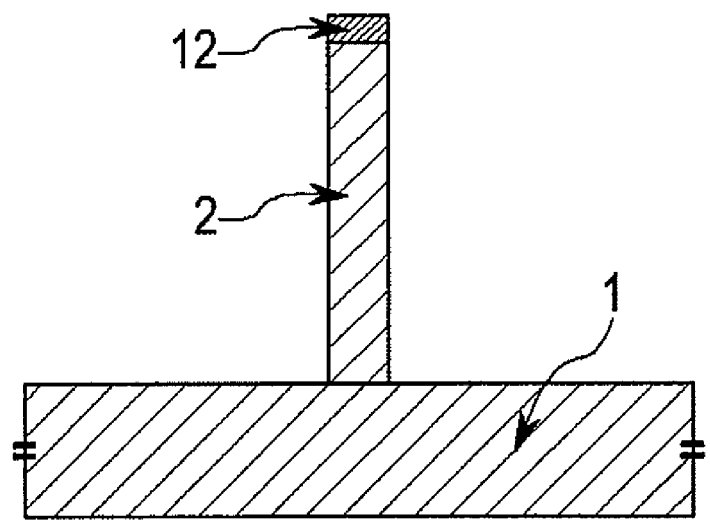
FIGS. 13a and 13b show a second embodiment of a process for making regions 1, 2 and 5 for making the inventive body structure.
Figure 13:
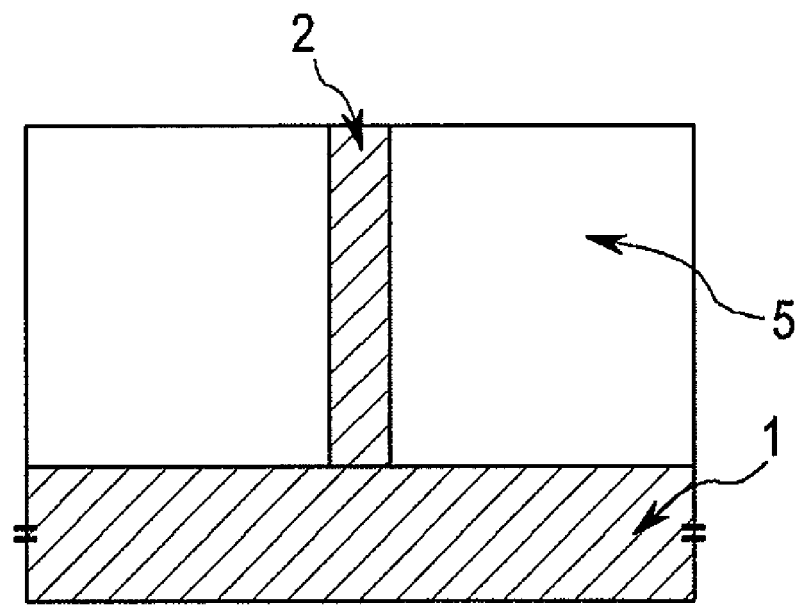

FIG. 13 shows one method for forming a silicon body in fabricating the structure shown in FIG. 4. On the silicon substrate of region 1, the insulating film of region 12 is formed, after which the insulating film is removed using a mask for defining the active body. Then, the silicon substrate is etched to a suitable depth of less than 500 nm as shown in part (a) of FIG. 13, thereby making the wall-type silicon body of region 2. A process for reducing the width of the silicon body may be additionally performed, and an annealing process for improving the sides of the silicon body may also be carried out. The insulating film is completely removed, and then the insulating film of region 3 is formed to a thickness of more than 1 nm, on which the nitride film of region 4 is formed. Then, a thick insulating film is formed and planarized, thereby forming the isolating oxide film of region 5 as shown in part (b) of FIG. 13.

Figure 14:
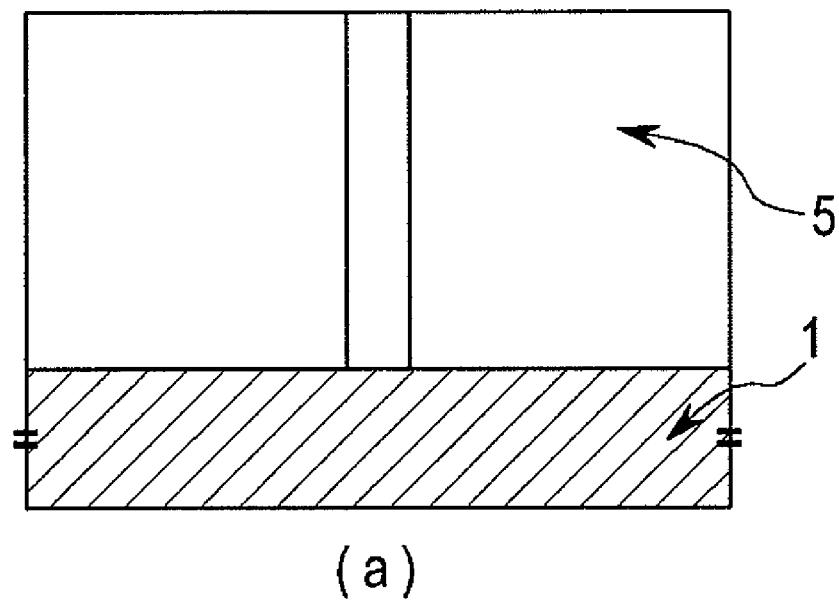
FIGS. 14a and 14b show a third embodiment of a process for making regions 1, 2 and 5 for making the inventive body structure.
Figure 14:
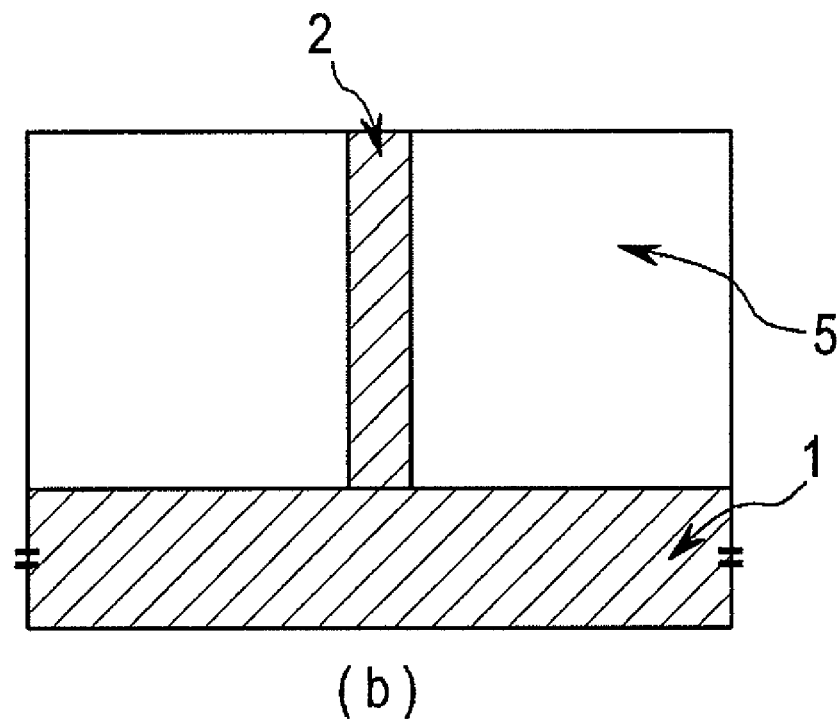

FIG. 14 shows one method for forming a silicon body in fabricating the structure shown in FIG. 4. On the silicon substrate of region 1, the insulating film of region 5 is formed to a thickness of less than 500 nm, and a portion on which the silicon body of region 2 will be formed is etched to expose the substrate. The exposed silicon portion is subjected to surface treatment to grow a good-quality silicon epitaxial layer. In this case, silicon formed above the oxide film is removed by planarization.

INDUSTRIAL APPLICABILITY

As described above, the present invention relates to the nano-scale flash memory device having a saddle structure, and the fabrication method thereof. More particularly, the present invention relates to the high-integration/high-performance flash memory device having a novel structure for improving the scaling-down characteristic and performance of the MOS-based flash memory device, and is industrially applicable.

The invention claimed is:

1. A flash memory device comprising:
   a silicon substrate having formed thereon a wall-type silicon body connected with the substrate;
   a first insulating film formed on the surface of the silicon substrate and the surface of the silicon body;
   a nitride film formed on the first insulating film;
   a second insulating film for element isolation formed on the nitride film so as to reach the surface level of the silicon body;
   a charge storage node, a control electrode, an inter-electrode insulating film and a control electrode, sequentially formed on the resulting structure;
   a region to be used as a channel, which is recessed from the surface of the silicon body to a reasonable depth;
   the second insulating film being, if necessary, recessed from the surface to a reasonable depth;
   the first insulating film and the nitride film being etched more than the recess width or depth of the silicon body;
   a tunneling insulating film formed on the surface and sides of the recessed region of the silicon body;
   a charge storage node, an inter-electrode insulating film and a control electrode sequentially formed on the resulting structure; and
   source/drain regions formed to a depth in the silicon body on both sides of the gate stack wherein the gate stack consisting of a charge storage node, an inter-electrode insulating film, and a control electrode, and an insulating film spacer formed on both sides of the gate stack.

2. The flash memory device of claim 1, wherein thickness of the nitride film formed on the first insulating film is adjusted to at least 2 nm such that the tunneling insulating film, the electrode storage node, the inter-electrode insulating film and the control electrode are formed easily also on the side channels of the recessed silicon body.

3. The flash memory device of claim 1, wherein the composition of the nitride film formed on the first insulating film is variable, and the nitride film can be replaced with an alternative insulating film material ensuring selective etching in the following process steps.

4. The flash memory device of claim 1, wherein the total width of the charge storage node, the inter-electrode insulating film and the control electrode, which are formed in the second insulating film for element isolation, is similar to or smaller than the etching width or the etching depth of the nitride film which is aligned with the sides of the recessed silicon body.

5. The flash memory device of claim 1, wherein, if the silicon bodies are formed close to each other, the surfaces of the first insulating film, the second insulating film and the nitride film between the silicon bodies formed closed to each other are formed lower than the surface of the recessed silicon body in a process of etching the insulating films to expose the sides of the recessed channel.

6. The flash memory device of claim 1, wherein the nitride film and first insulating film adjacent to the recessed silicon body to be used as the channel are etched to more wide width and deeper depth than those of the recessed silicon body, but the second insulating film is not etched, and the charge storage node, the inter-electrode insulating film and the control electrode are formed to be aligned with the recessed channel.

7. The flash memory device of claim 1, wherein the second insulating film for element isolation is formed on the first insulating film and planarized to the surface level of the silicon body; the silicon body is recessed to a reasonable depth to form the channel; a portion of the first insulating film and the second insulating film, which is around the recessed silicon body, is recessed to be aligned with the recessed silicon body region, in which the width and depth of the recess are made larger than those of the recessed silicon body so as to expose the side channels of the recessed silicon body; the tunneling insulating film is formed on the surface and sides of the recessed silicon body; the charge storage node, the inter-electrode insulating film and the control electrode are sequentially formed on the resulting structure; source/drain regions formed to a depth in the silicon body on both sides of the gate stack wherein the gate stack consisting of a charge storage node, an inter-electrode insulating film, and a control electrode, and an insulating film spacer formed on both sides of the gate stack.

8. The flash memory device of claim 1, wherein the second insulating film for element isolation is formed on the first insulating film and planarized to the surface level of the silicon body; the silicon body is recessed to a reasonable depth to form the channel; only a portion of the first insulating film and the second insulating film, which is around the silicon body, is etched to expose the side channels of the recessed silicon body; the tunneling insulating film is formed on the surface and sides of the recessed silicon body; the charge storage node, the inter-electrode insulating film and the control electrode are sequentially formed on the resulting structure; and source/drain regions formed to a depth in the silicon body on both sides of the gate stack wherein the gate stack consisting of a charge storage node, an inter-electrode insulating film, and a control electrode, and an insulating film spacer, formed on both sides of the gate stack.

9. The flash memory device of claim 8, wherein, if the silicon bodies are formed close to each other, the surfaces of the first insulating film and the second insulating film between the silicon bodies formed close to each other are formed lower than the surface of the recessed silicon bodies in a process of etching the insulating films to expose the sides of the recessed channel.

10. The flash memory device of claim 1 wherein the silicon body formed of single crystalline silicon, which includes the source/drain regions and the channel, has a width ranging from 4 nm to 200 nm.

11. The flash memory device of claim 1, wherein the silicon body, which includes the source/drain regions and the channel, has a height of 10-1000 nm from the surface of the silicon substrate.

12. The flash memory device of claim 1, wherein the silicon body is opened for recess to a width of at least 10 nm and recessed to a depth of 5-500 nm.

13. The flash memory device of claim 1, wherein the bottom corners of the recessed channel formed in the silicon body are formed at a right angle, an obtuse angle, an acute angle or are rounded.

14. The flash memory device of claim 1, wherein the surface of the recessed region of the silicon body is formed with the channel of the device, and at the same time, the sides of the recessed channel surface are exposed at a distance of 1-100 nm so as to serve as side channels.

15. The flash memory device of claim 1, wherein the tunneling insulating film is formed on the surface and sides of the recessed channel of the silicon body to the same or different thicknesses in a range of 1-11nm.

16. The flash memory device of claim 1, wherein the surface and sides of the recessed channel of the silicon body have corners therebetween, in which the corners are formed at a right angle, an obtuse angle, an acute angle or are rounded.

17. The flash memory device of claim 1, wherein the cross-sectional shape of the silicon body is either narrower in width at the upper portion and then gradually wider toward the silicon substrate, or vertical around a portion in which the channel is formed and then gradually wider toward the silicon substrate.

18. The flash memory device of claim 1, wherein the charge storage node is formed in the form of a continuous film or nano-scale dots having a size of less than 50 nm, and the materials that can be used for the storage node are polysilicon, amorphous silicon, poly-SiGe, amorphous SiGe, metals, metal oxides having different work functions, metal alloy, nitrides with various composition, high-k dielectrics with various composition.

19. The flash memory device of claim 1, wherein, if the charge storage node is formed of a conductive and continuous film, cells are isolated from each other.

20. The flash memory device of claim 1, wherein the inter-electrode insulating film is formed of one or a stack of two or more selected from high-k dielectrics, including oxide, nitride and Al2O3, and has a final thickness of 2-30 nm.

21. The flash memory device of claim 1, wherein the control electrode is made of one among polysilicon, amorphous silicon, poly-SiGe, amorphous SiGe, various metals, various metal alloys, and silicides with various metals, or is formed to have a stack of said materials.

22. The flash memory device of claim 1, wherein the spacer is made of various insulating films or a combination of said insulating films, and is formed to a thickness of at least 5 nm and a width covering the storage electrode exposed on the surface of the silicon body.

23. The flash memory device of claim 1, wherein the charge storage node, the inter-electrode insulating film and the control electrode are formed only in the recessed region to almost the same height as the surface of the body, or formed above the surface of the body to a protrusion height of less than 500 nm, and in some cases, can be formed without the storage electrode only above the surface of the body.

24. The flash memory device of claim 1, wherein the total width of the charge storage node, the inter-electrode insulating film and the control electrode, formed above the surface of the silicon body, is larger or smaller than the total width below the surface of the silicon body.

25. The flash memory device of claim 1, wherein the etching width and depth of the patterned second insulating film are made different from the etching width and depth of the silicon body, or are formed equal to the etching width and depth of the silicon body, or only the etching depth of the patterned second insulating film is made shallower than the etching depth of the silicon body.

26. The flash memory device of claim 1, wherein the junction depth of the source/drain regions is in a depth of less than 500 nm from the non-etched surface of the silicon body, or the junction depth is made deeper such that the erase speed by the source or drain can be fast.

27. The flash memory device of claim 1, wherein, in forming a contact hole after forming the source/drain regions and the insulating film spacer, the contact hole is formed to be butted to the insulating film spacer, or the contact hole is formed such that a metal layer can be contacted with the surface and sides of the silicon body having the source/drain regions formed therein, in order to reduce the resistance of the regions, and the length on the sides of the silicon body overlapped by the metal layer is less than 400 nm.

28. The flash memory device of claim 1, wherein, if the silicon bodies are formed within an adjacent distance, the surfaces of the insulating film, the nitride film and the insulating film between the adjacent silicon bodies are formed lower than the surfaces of the recessed silicon bodies in a process of etching the insulating films, to expose the sides of the recessed channel.

29. The flash memory device of claim 1, which has a structure in which a saddle-type flash device structure having a channel formed by exposing the surface and side-walls of the recessed silicon body, and a MOS device with a non-recessed channel which is formed on the surface of the silicon body, are integrated on the same chip by using one additional mask.

30. A method for fabricating a flash memory device, comprising the steps of:
forming on a silicon substrate a wall-type silicon body connected with the substrate;
forming a first insulating film on the surface of the silicon substrate and the surface of the silicon body;
forming a nitride film on the first insulating film;
forming a second insulating film for element isolation on the nitride film to be planarized to the surface level of the silicon body;
recessing the surface of the silicon body to a reasonable depth to form a region to be used as a channel, and if necessary, recessing the surface of the second insulating film to a reasonable depth;
etching the first insulating film and the nitride film more than the recess width or depth of the silicon body;
forming a tunneling insulating film on the surface and sides of the recessed region of the silicon body;
forming on the resulting structure a charge storage node, an inter-electrode insulating film and a control electrode, in order;
sequentially forming source/drain regions and a insulating film spacer on both sides of the control electrode; and
forming on the resulting structure a silicide film, if necessary, and then an insulating film, a contact hole and a metal layer, in order.

31. The method of claim 30, wherein the silicon body, the first insulating film, the nitride film and the second insulating film are recessed in varying orders depending on given process conditions.

32. The method of claim 30, wherein the step of forming the silicon body and the element isolating film comprises the steps of: forming on the silicon substrate a mask for the silicon body; etching the silicon substrate to form the silicon body; performing a process of reducing etch damage (oxide film growth and removal, special cleaning or hydrogen annealing); forming the first insulating film; forming the nitride film; and depositing and planarizing the second insulating film.

33. The method of claim 30, wherein the insulating films including the second insulating film, which are recessed with aligned with the silicon body to be recessed, are etched using a second nitride film or an oxide film formed on a material selected from polysilicon and amorphous silicon, as a hard mask.

34. The method of claim 30, wherein the step of forming the silicon body and the element isolation film comprises the steps of: forming the second insulating film on the silicon substrate; forming a mask for the silicon body; etching the second insulating film to expose the silicon substrate; performing a process of reducing silicon surface damage caused by etching process wherein the etching process having oxide film growth and removal, or hydrogen annealing; growing a silicon epitaxial layer; and performing planarization to the level of the isolating insulating film.

35. The method of claim 30, wherein, before forming the tunneling insulating film on the surface and sides of the recessed channel of the silicon body, a surface treatment process, including hydrogen annealing, is performed to improve the surface properties of the silicon channel.

* * * * *